United States Patent
Ziegelmayer

(10) Patent No.: US 7,283,395 B2
(45) Date of Patent: Oct. 16, 2007

(54) MEMORY DEVICE AND METHOD FOR OPERATING THE MEMORY DEVICE

(75) Inventor: Marco Ziegelmayer, Loschwitz (DE)

(73) Assignee: Infineon Technologies Flash GmbH & Co. KG, Dresden (DE)

( * ) Notice: Subject to any disclaimer, the term of this patent is extended or adjusted under 35 U.S.C. 154(b) by 99 days.

(21) Appl. No.: 11/166,788

(22) Filed: Jun. 24, 2005

(65) Prior Publication Data

US 2006/0291301 A1 Dec. 28, 2006

(51) Int. Cl.
*G11C 16/04* (2006.01)
*G11C 16/06* (2006.01)

(52) U.S. Cl. .......................... 365/185.19; 365/185.01; 365/185.09; 365/185.11

(58) Field of Classification Search ........... 365/185.01, 365/185.19
See application file for complete search history.

(56) References Cited

U.S. PATENT DOCUMENTS

| | | | |
|---|---|---|---|
| 5,905,993 A * | 5/1999 | Shinohara | 711/103 |
| 6,011,725 A | 1/2000 | Eitan | |
| 6,954,378 B2 * | 10/2005 | Tanaka | 365/185.19 |
| 2001/0050377 A1 * | 12/2001 | Ikehashi et al. | 257/200 |
| 2002/0075728 A1 * | 6/2002 | Mokhlesi | 365/185.33 |
| 2003/0151950 A1 * | 8/2003 | Tamada et al. | 365/185.19 |
| 2005/0024978 A1 * | 2/2005 | Ronen | 365/232 |

FOREIGN PATENT DOCUMENTS

WO    WO 2005/010638 A2    2/2005

* cited by examiner

*Primary Examiner*—Ly Duy Pham
(74) *Attorney, Agent, or Firm*—Slater & Matsil, L.L.P.

(57) ABSTRACT

A memory device comprises a memory cell array (1) with a multitude of memory cells (111). Each of the memory cells (111) is assigned to one of a multitude of blocks (15). Each memory cell (111) is accessible by an access signal in order to alter stored information. Each of the memory cells (111) is assigned to one of a multitude of blocks (15). The memory device further comprises a measuring unit (100) coupled to the memory cell array (1) and being operable to identify a selected access characteristic of each of the memory cells (11) and an assignment unit (150) which is coupled to the measuring unit (100) and is operable to assign a performance parameter (215) to each block (15). A performance memory unit (2) is adapted to contain the performance parameters (215) assigned to the blocks (15).

27 Claims, 2 Drawing Sheets

MEMORY DEVICE AND METHOD FOR OPERATING THE MEMORY DEVICE

TECHNICAL FIELD

The present invention relates to a memory device having a memory cell array having blocks of memory cells. The invention further relates to a method for operating such memory device.

BACKGROUND

An EEPROM or electrically erasable programmable read-only memory is a non-volatile storage unit used in computers or other devices. An EEPROM can be programmed and erased electrically multiple times. Each bit is set by quantum tunneling electrons across a thin dielectric barrier. Because of this it may be erased and reprogrammed only a certain number of times, but an EEPROM can be read for an unlimited number of times.

EEPROM memory cells may comprise different kinds of memory cells, for example a floating gate cell or a so-called nitride programmable read-only memory (NROM) cell. The NROM cell is described in U.S. Pat. No. 6,011,725, which is incorporated herein by reference.

The NROM cell has two doping areas and a channel that is located between the doping areas. A gate electrode is arranged above the channel region insulated by a dielectric layer that is arranged between the channel region and the gate electrode. The dielectric layer includes an oxide-nitride-oxide layer comprising a nitride layer serving as a charge-trapping layer sandwiched between the insulating oxide layers, which avoid vertical retention. Two bits are stored in physically different regions of the nitride layer. A first bit region is located near the first doping area and a second bit region is located near the second doping area.

The bits are programmed by means of channel hot electron programming. Electrons may be injected from the channel into the charge-trapping region according to applied voltages. Programming of a first bit may be performed by applying a programming voltage to the first doping area and the gate while grounding the second doping area. The electrons are injected and trapped in the first bit region. Likewise programming of a second bit may be performed by applying the programming voltage to the second doping area in the gate while grounding the first doping area. For erasing a bit, hot holes or Fowler-Nordheim tunneling can be used. Erasing of the first bit may be performed by applying erasing voltages to the gate or to the first doping area and the gate resulting in a lateral field. Holes are caused to flow through the bottom oxide layer for compensating the charge of the electrons.

The step of applying programming or erasing voltages is performed by applying a sequence of several pulses. The number of pulses that are needed to program or erase the memory cell may differ from cell to cell. Nevertheless, the number of pulses increases with the number of programming or erasing cycles that have already been performed. Programming and erasing a memory cell is a general concept that is not limited to NROM cells.

A bit information stored in the NROM cell is read by applying a reverse voltage between the first and second doping areas compared to the programming voltage that is used to program the bit. Relatively small charges near the grounded one of the first or second doping area prevent or reduce current flow, for example reading of the first bit may be performed by applying reading voltages to the second doping area and the gate. The first doping area may be grounded. The current flows while there are no trapped charges inside the first bit region. While there are trapped charges or electrons inside the first bit region the current flow is reduced or the current does not flow. Reduced current flow represents a first binary value of the programmed bit and normal current flow represents a second binary value of the bit.

In order to perform memory access to the memory cells, the memory device further comprises a controller that is coupled to the memory cell array and executes memory access to the memory cells. Normally the memory cell array is organized in blocks. Each of the memory cells is assigned to one of the blocks. The memory access may be performed block wise. This means that a group of bits is preferably programmed in the same block. Furthermore, the memory cells assigned to the same block may be erased synchronistically.

The memory device is generally tested for functionality by the manufacturer before delivery. Blocks that comprise at least one defect memory cell may be marked as so-called bad blocks or replaced with redundant blocks. The controller does not execute memory access to these bad blocks. Testing may comprise performing memory access to each memory cell by applying an access signal in order to program or erase the memory cells. The access signal may comprise several pulses. The number of pulses needed to perform access, by programming or erasing, to the memory cell is determined during the testing routine. If the memory cell cannot be accessed by a given number of pulses it is assumed that the memory cell is defective. Consequently, the block including the defective memory cell is marked as a bad block.

During normal operation mode of the memory device, programming and erasing of the memory cells is performed many times. Due to deterioration of the memory cells, blocks that are programmed and erased more often than other blocks wear much faster. The lifetime of a block may be defined by a given number of programming or erasing cycles that can be performed to the memory cells of the block. After having performed the given number of programming or erasing cycles, the memory cells possibly become defective because of their limited lifetime. The block may be marked as a bad block resulting in not using it any more. Consequently, the storage capacity of the memory device decreases block wise during its lifetime if more and more blocks are marked as bad blocks.

The controller may perform memory access using so-called wear leveling. Wear leveling is a technique in order to spread wear caused by repeated programming or erasing evenly across the memory cell array and thus avoid wearing out specific blocks of the memory cell array. The wear leveling technique can be done by the controller. The controller selects the block for executing memory access based upon the number of writing or erasing cycles that have been performed so far. After having reached the given number of writing or erasing cycles the block is marked as a bad block.

Marking does not depend on the real state of the block but only on the number of writing or erasing cycles. Consequently, if the given number that defines the lifetime of the block is underestimated, the block is marked as a bad block although it still functions. Sometimes memory access is still executed to a block that has become defective although the given number of writing or erasing cycles has not been reached. The lifetime of a block is defined merely by a given number of writing or erasing cycles, not considering the real state of the memory cells of the block. Consequently, the defined lifetime of the block is based on an underestimation of the real lifetime of the memory cells.

SUMMARY OF THE INVENTION

The present invention discloses a memory device comprising a memory cell array with memory cells. Each memory cell has a selected access characteristic and is operable to store information. Each memory cell is accessible by an access signal in order to alter the stored information. Each memory cell is assigned to one of the blocks and a performance parameter is assigned to each block. The memory device further comprises a measuring unit that is coupled to the memory cell array and is operable to identify the selected access characteristic of each memory cell in response to the access signal. The memory device further includes an assignment unit coupled to the measuring unit. The assignment unit is operable to assign a performance parameter to each block. A performance memory unit is coupled to the memory cell array and the assignment unit. The performance memory device is adapted to contain the performance parameters assigned to the blocks.

One aspect of the invention is that the performance memory unit contains information about the state of the memory cells of a block based upon their characteristics. The characteristics indicate the deterioration more precise than counting the number of access cycles. On the other hand, memory access may perform to the memory cells of a block until the characteristics indicate that one or more memory cells of the block are defective. Thus, the blocks may be used more often than the estimated given number of access cycles.

A major benefit of certain embodiments of the invention is that a controller may use the performance parameters of the performance memory unit in order to perform wear leveling based upon these performance parameters. Memory access to memory cells assigned to the blocks that are in good condition may be preferred.

In case the access signal is a pulse sequence, a beneficially selected characteristic may be a number of pulses that are needed to alter the stored information of the memory cell. This number can be determined in an easy way by the measuring unit forming a counter being operable to determine the needed number of pulses. The assignment unit assigns the largest number of pulses to the performance parameter. Thus, the state of the block is defined by its worst memory cell.

Embodiments of the invention may further comprise a multitude of sectors. Each block is assigned to one of the sectors. The memory device is operable to erase all memory cells assigned to the sector resulting in storing the same information in all memory cells. For that purpose the stored information of a group of memory cells is altered in order to store the same information in all cells assigned to the sector after having performed altering of the stored information.

Further performance parameters may be assigned to each sector. The controller may be amended in order to select the block for memory access based upon the performance parameters of the blocks and/or the sectors.

In another embodiment, the present invention discloses a method for operating such a memory device includes applying an access signal to the memory cells assigned to one of the multitude of blocks in order to alter the information stored in a group of the memory cells assigned to that block; identifying the characteristic of each memory cell of the group of the memory cells assigned to that block in response to the access signal; assigning a performance parameter to that block based upon the identified characteristics; and entering the performance parameter into a list of the performance memory unit.

For the purpose of erasing the block the group is selected in order to store the same information into each memory cell, which is assigned to the block, after altering has been performed.

In case of programming the memory cells the group is selected in order to store the desired information into each memory cell assigned to the block.

Assigning of the performance parameter is based upon the identified characteristics of the memory cells whose information has altered. Thus, the groups include favorably each memory cell assigned to the block in order to indicate the state of the block precisely by the resulting performance parameter.

The access signal includes a pulse sequence. The characteristic of the memory cells is identified in response to the pulse sequence. A characteristic that is detectable by a counter in an easy way is how many pulses are needed in order to alter the stored information of the memory cell. The resulting performance parameter is the maximum number of pulses in order to alter the group of memory cells. This performance parameter can be assigned by detecting if the information stored in the group of memory cells has already altered while counting the number of pulses.

The performance parameters are entered in a list stored in the performance memory unit. After having performed memory access to one of the blocks the entries may be overwritten in order to get the actual state of the block. Alternatively, a comparison between the assigned performance parameter and the respective performance parameter stored in the list is performed and the performance parameter stored in the list is overwritten in case the assigned performance parameter is worse.

The method of performing memory access to such a memory device comprises selecting one of the multitude of blocks based upon the list and executing memory access to the memory cells assigned to the selected block. Selecting takes the deterioration state of the blocks into account. Favorably the block having the best performance parameter is selected.

If the number of pulses that are needed to alter the stored information are larger than a given value, the respective block is assigned to a group of defective blocks. Memory access is not executed to blocks that are assigned to that group because their functionality is not ensured any longer.

These and other features and advantages of the invention will become apparent from the following brief description of the drawings, detailed description and appended claims.

DESCRIPTION OF THE DRAWINGS

For a more complete understanding the present invention and its advantages, reference is now made to the following descriptions taken in conjunction with the accompanying drawings, in which.

Figure 1:
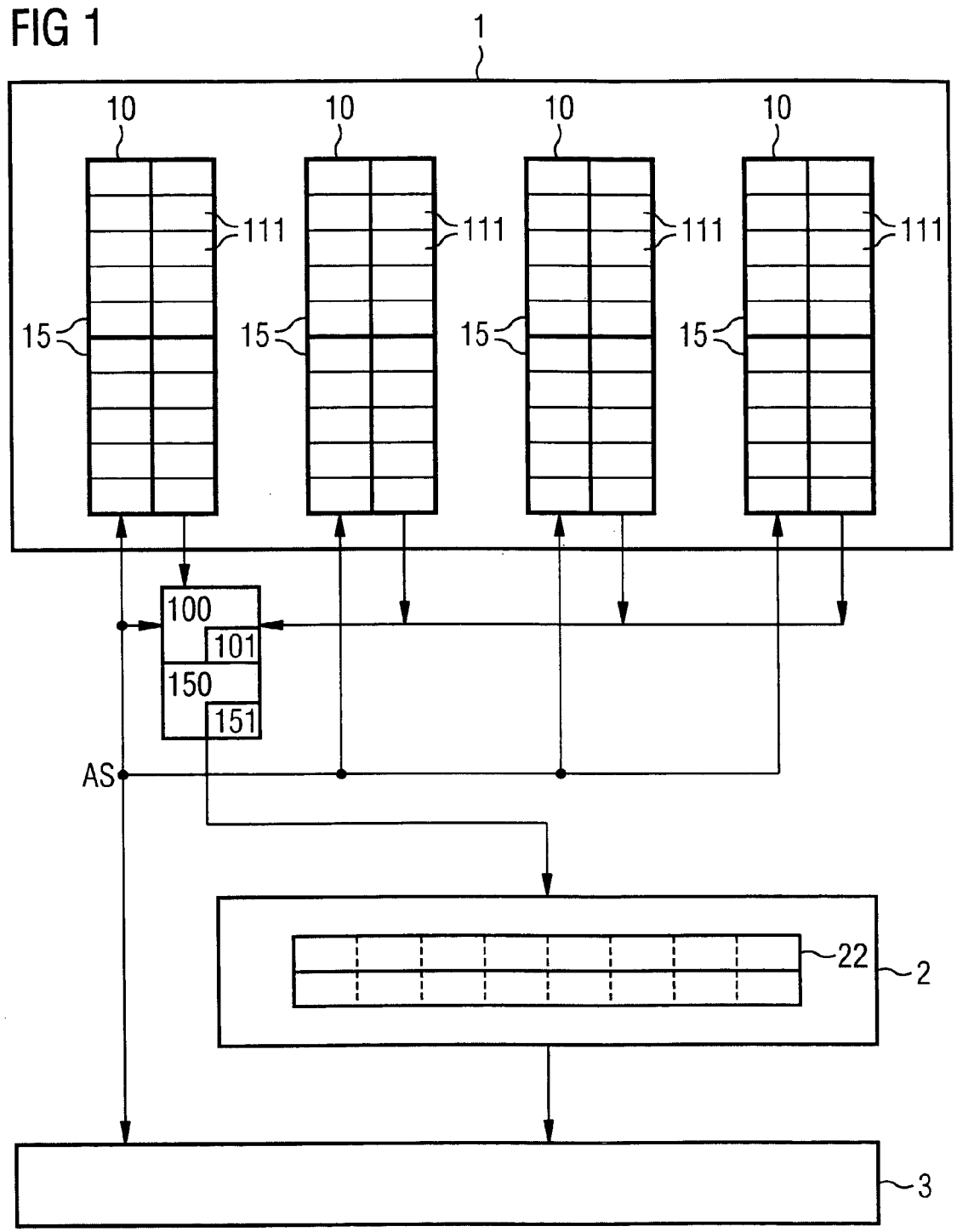
FIG. 1 shows a block diagram of the memory device according to the invention.

The following list of reference symbols can be used in conjunction with the figures:

1 memory cell array
2 performance memory unit
3 controller 10 sector
15 block
22 list
100 measuring unit
101 counter
111 memory cell
150 assignment unit
151 register
210, 215 performance parameter
AS access signal

DETAILED DESCRIPTION OF ILLUSTRATIVE EMBODIMENTS

Preferred embodiments are discussed in detail below. However, it should be noted that the present invention provides many applicable concepts than can be embodied in a wide variety of specific contexts. The specific embodiments discussed are merely illustrative of specific ways to make and use the invention and do not limit the scope of the invention.

FIG. 1 shows an embodiment of a memory device comprising a memory cell array 1 including a multitude of memory cells 111. Each memory cell 111 is assigned to one of a multitude of blocks 15. Furthermore, each block 15 is assigned to one of a multitude of sectors 10. It is possible that the sector 10 includes only one block 15.

Each memory cell 111 is operable to represent one or more bits. In the case of an NROM cell, each memory cell may represents two bits. The memory cells 111 may be programmed and erased electrically multiple times, but their lifetime is limited by deterioration depending substantially on the number of writing and erasing cycles that have been performed.

A controller 3 executes memory access, which includes programming and erasing, to the memory cells 111. Erasing of the memory cells 111 of the block 15 implies the step of storing the same information into each memory cell 111 of the block 15, for example a logic one or a logic zero. In case of NROM cells, each NROM cell may represent two equal binary values. Thus, the same information is stored in each memory cell 111 assigned to the block 15. The step of programming a block 15 implies writing selected information into each memory cell 111 of the block 15. The selected information may differ from memory cell to memory cell. Writing may be performed after having erased all memory cells 111 assigned to the block 15 by altering the stored information of the selected group of memory cells 111.

Normally memory access is performed block wise. This means that a group of bits or bytes is written into the memory cells 111 of the same block 15 in parallel. The memory cells 111 of a block 15 may also be erased in parallel. The blocks that are assigned to a sector are erased in parallel. The memory cells are programmed block wise and are erased sector wise. Consequently, more memory cells 111 can be erased at the same time than the number of memory cells 111 that can be programmed in parallel.

An access signal AS comprising a programming or an erasing signal is applied to the memory cells 111 of the block 15 or the sector 10 in order to program or erase, respectively.

Programming of one of the memory cells 111 is performed by applying the programming signal to the respective memory cells 111. The programming signal includes several pulses. The number of pulses needed to program the memory cell 111 depends on a state of this memory cell 111. The number of pulses increases with accumulative deterioration of the memory cell 111.

Like programming, erasing is performed by applying an erasing signal comprising several pulses. The step of erasing can be performed by applying the erasing signal only to memory cells 111 storing information that has to alter. Alternatively, the erasing signal is applied to each memory cell 111 assigned to the block 15 or to the sector 10 resulting in altering the stored information if required. The number of pulses in order to erase the memory cell 111 depends on the state of the memory cell 111 resulting in an increasing number of pulses with an increasing number of erasing cycles already having been performed.

Typically memory access is performed by first erasing the memory cells 111 assigned to the sector 10 or the block 15 and then programming the memory cells 111 assigned to the block 15 by altering the stored information of a selected group of the memory cells 111 in order to store the desired information.

The state of the memory cell 111 and its degree of deterioration can be estimated by the number of pulses that are needed to program or erase the memory cell 111. This estimation is more precise than merely counting the number of programming or erasing cycles that have already been performed. An initial state of the memory cell and accelerated or decelerated ageing is taken into account.

The state of the block 15 is indicated by a performance parameter that is based upon the counted numbers needed to program or erase each memory cell 111 assigned to the block 15. Typically the block 15 is characterized by its worst memory cell 111. Consequently, the performance parameter is the maximum number of pulses that are needed to program the memory cells 111 of the block 15. A further performance parameter assigned to the block 15 may indicate the number of pulses that are needed in order to erase the memory cells 111 assigned to the block 15. Because erasing is performed section wise it is beneficial to assign this further performance parameter to the section 10, which comprises several blocks 15.

A measuring unit 100 is coupled to the memory cells 111 and to the access signal AS. The measuring unit 100 is operable to identify the characteristic of each of the memory cells 111 in response to the access signal AS. The measuring unit further comprises a counter 101 which is operable to detect when a pulse of the access signal AS occurs and to count the number of pulses. The measuring unit identifies the number of pulses that are needed to alter the stored information, for example, by means of detecting whether the information of the memory cells assigned to the block 15 stores the designated information that is to be programmed. Alternatively, means of detecting whether the stored information has altered are comprised. Consequently, identifying may include measuring if the information stored in the memory cells 111 to be programmed has altered, or if the information stored in the memory cells 111 to be programmed has changed to the desired information. In case of erasing, the detection may include measuring whether each memory cell 111 of the block 15 or the sector 10 stores the same information. The characteristics of memory cells 111 whose information should not alter cannot be identified.

An assignment unit 150 is coupled to the measuring unit 100 being operable to assign the performance parameter to each block 15. The performance parameter is determined as the maximum number of pulses needed to alter the stored information of the memory cells 111 assigned to the block 15. For this purpose, there are means for detecting if programming or erasing of the group of memory cells 111 has already been performed. In this case, the counter is stopped, although further pulses may occur, and the number of pulses is provided, for example, in a register 151.

Figure 2:
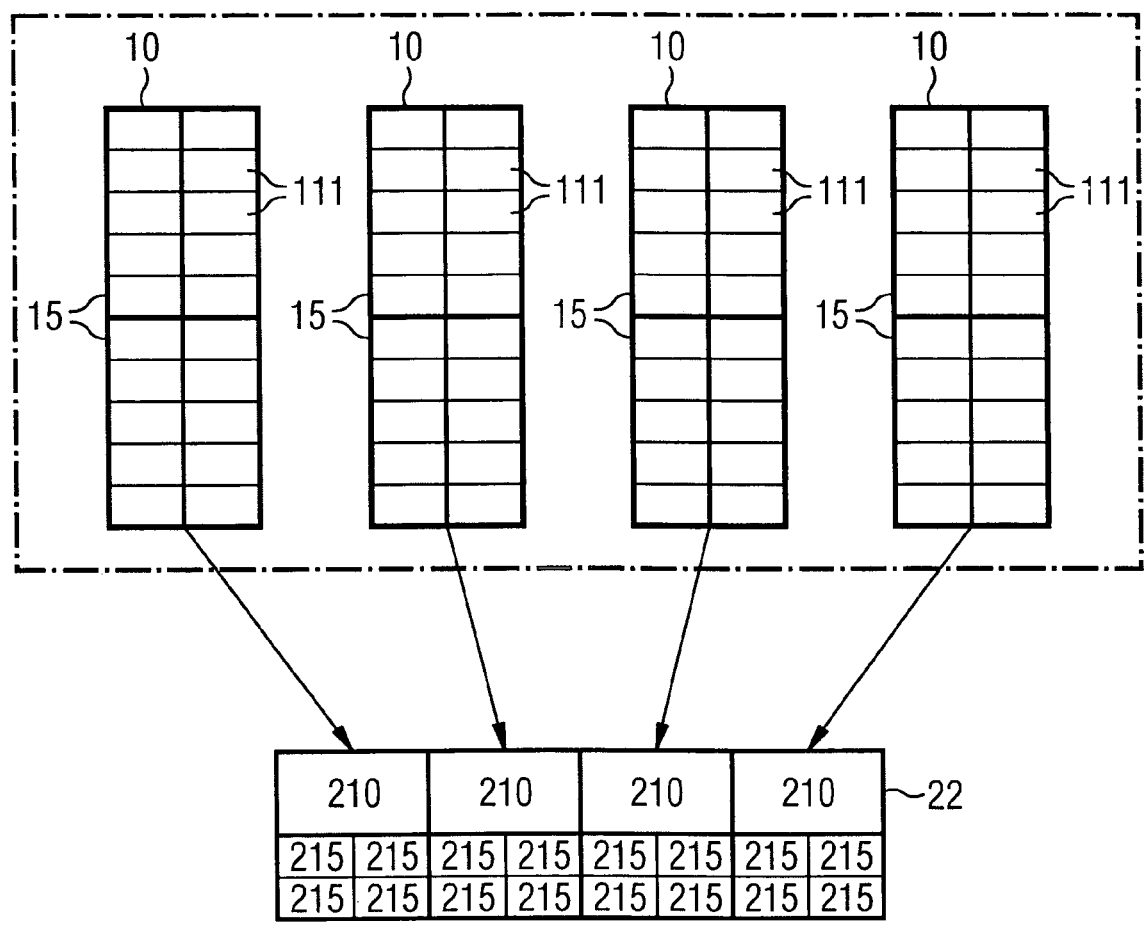
FIG. 2 shows a block diagram of an assignment of entries of the performance memory unit for the embodiment of FIG. 1.

The measurement unit 100 may detect the number of pulses in order to program or erase each of the memory cells 111 assigned to the block 15 or to the sector 10 and the assignment unit 150 assigns the performance parameter 215, 210 (as shown in FIG. 2) to the maximum number of pulses.

Alternative assignments of the performance parameters are possible. The performance parameter may indicate the average number of pulses.

Each time memory access is performed to the memory cells 111 assigned to the block 15 or to the sector 10, their characteristics can be identified. Consequently, the assignment of the respective performance parameter 215, 210 can be performed after each memory access to the block 15 or to the sector 10.

The assignment of the performance parameter depends only on the memory cells storing information that has to alter. Consequently, the performance parameter indicates the state of the group of the memory cells 111 assigned to the block 15. The composition of the group varies depending on the memory cells 111 that are programmed or erased. Thus, the performance parameter 215 also may vary and indicate an average state of the block 15.

The state of each memory cell 111 assigned to the block 15 is considered if a testing mode is implemented. The testing mode comprises erasing all memory cells 111 of the memory cell array 1 and then programming each cell 111 of the memory cell array 1. Thus, the assigned performance parameter considers the state of each memory cell 111 assigned to each block 15.

The memory device further comprises a performance memory unit 2, which is coupled to the controller 3. The performance memory unit 2 is adapted to contain a list 22 of the performance parameters of each block 15. The list 22 is also shown in FIG. 2.

Favorably, a first performance parameter 215 represents the maximum number of pulses needed to program the memory cells 111 of the block 15 and a second performance parameter 210 represents the maximum number of pulses needed to erase the memory cells 111 assigned to the block 15. Alternatively, the second performance parameter 210 represents the pulses needed to erase the memory cells 111 assigned to the sector 10.

FIG. 2 shows a block diagram of an assignment of entries of the performance memory unit 2. The list 22 contains entries 215, which are assigned to each block 15 and entries 210 assigned to each sector 10. The performance parameters 210, 215 are based upon different ways of executing memory access. The entries 215 assigned to blocks 15 are generated in response to programming. The entries 210 assigned to sectors 10 are generated in response to erasing.

The performance memory unit 2 may form a part of the memory cell array 1 or a separate memory unit. The performance memory unit 2 may comprise volatile memory. In this case the entries of the list 22 are entered before the normal operating mode of the memory device, for example, by performing a testing routine comprising erasing and programming of each memory cell 111 of the memory cell array 1 and assigning the performance parameters 210, 215. The performance memory unit 2 may comprise non-volatile memory, especially if the memory device comprises NROM cells. In this case the testing mode has to be performed just once.

Favorably, the memory device comprises a chip with the memory cell array 1 and the performance memory unit 2, which are accessible by the external controller 3.

The controller 3 is coupled to the performance memory unit 2 in order to access the list 22 or to download the list 22. The controller 3 performs memory access by programming or erasing the memory cells. The selection of the block 15 for memory access is performed by the controller 3 using the technique of wear leveling based upon the list 22. This means that the step of selecting the block 15 is based on the state of the block 15 or the state of the sector 10, which the block 15 is assigned to, indicated by its performance parameter 210, 215 and not only by the numbers of cycles that have been performed before. For example, the controller 3 executes memory access to the block 15 with the best performance parameter 215.

The performance parameter 210, 215 may be stored each time memory access is performed as the actual deterioration indicator in the list 22. This list 22 may be accessible at any time by the controller 3, for example, via a specific test mode of the controller 3. Alternatively, the test mode can be modified in order to test all the memory cells 111 for functionality and then the resulting performance parameters are entered into the list 22 of the performance memory unit 2. The assigned performance parameters 210, 215 that are assigned during a normal operation mode of the memory access may overwrite the performance parameters contained in the list 22 only if they are worse.

Marking bad blocks is performed based on the numbers that are necessary to program or erase the memory cells 111 of the block 15. If a given number of pulses, for example, thirty, is increased during programming or erasing, the block 15 is marked as a bad block. If the number of pulses is getting close to the given number of allowed pulses, other blocks should be selected by the wear leveling. Consequently, the storage capacity of the memory device is available during the whole lifetime of the memory device.

What is claimed is:

1. A memory device comprising:
    a memory cell array comprising a multitude of memory cells, each memory cell having a selected access characteristic and operable to store information, each memory cell being accessible by an access signal comprised of a pulse sequence for altering the stored information, each of the memory cells assigned to one of a multitude of blocks;
    a measuring unit coupled to the memory cell array for determining the number of pulses in said access signal during an alteration of information in the memory cell and operable to identify the selected access characteristic of each of the multitude of memory cells in response to the access signal;
    an assignment unit coupled to the measuring unit and operable to assign a performance parameter to each block; and
    a performance memory unit coupled to the assignment unit, the performance memory unit adapted to contain the performance parameters assigned to the blocks.

2. The memory device according to claim 1 further comprising a controller coupled to the memory cell array and to the performance memory unit, the controller operable to select one of the multitude of blocks based upon the performance parameters contained in the performance memory unit and to execute memory access to memory cells assigned to the selected block.

3. The memory device according to claim 1 wherein the characteristic depends on a deterioration state of the memory cell.

4. The memory device according to claim 1, wherein the assignment unit is operable to determine an extreme value of the identified characteristics of the memory cells assigned to the block and to assign the extreme value as the performance parameter.

5. The memory device according to claim 1, wherein the measuring unit is operable to detect the alteration of the stored information of the memory cell in response to the access signal.

6. The memory device according to claim 1, wherein the assignment unit is operable to determine a maximum number of the determined numbers of pulses in order to alter the stored information of a selected group of memory cells assigned to the block.

7. The memory device according to claim 6, wherein the selected group of memory cells comprises each memory cell assigned to the block.

8. The memory device according to claim 1 wherein the device is operable to alter the information of a selected group of memory cells assigned to the block in order to store the same information into each memory cell assigned to the block.

9. The memory device according to claim 1 wherein each block is assigned to one of a multitude of sectors, the memory device operable to alter a selected group of the memory cells assigned to the sector in order to store the same information into each memory cell assigned to the sector.

10. The memory device according to claim 1 wherein the memory cells comprise NROM cells.

11. A memory device comprising:
a memory cell array comprising a multitude of memory cells, each memory cell having a selected access characteristic and operable to store information, each memory cell being accessible by an access signal comprised of a pulse sequence for altering the stored information, each of the memory cells assigned to one of a multitude of blocks;
a measuring unit coupled to the memory cell array and operable to identify the selected access characteristic of each of the multitude of memory cells in response to the access signal, said measuring unit operable to determine the number of pulses in order to alter the stored information of the memory cell;
an assignment unit coupled to the measuring unit and operable to assign a performance parameter to each block and to determine a maximum number of pulses in order to alter the stored information of a selected group of memory cells assigned to the block; and
a performance memory unit coupled to the assignment unit, the performance memory unit adapted to contain the performance parameters assigned to the blocks.

12. A memory device comprising:
a memory cell array comprising a multitude of memory cells, each memory cell having a selected access characteristic and operable to store information, each memory cell being accessible by an access signal in order to alter the stored information, each of the memory cells assigned to one of a multitude of blocks and wherein each block is assigned to one of a multitude of sectors, the memory device operable to alter a selected group of the memory cells assigned to the sector in order to store the same information in each memory cell assigned to its sector;
a measuring unit coupled to the memory cell array and operable to identify the selected access characteristic of each of the multitude of memory cells in response to the access signal;
an assignment unit coupled to the measuring unit and operable to assign a performance parameter to each block and to assign a further performance parameter to each sector, and the performance memory unit is further adapted to contain the further performance parameters assigned to the blocks and the sectors; and
a performance memory unit coupled to the assignment unit, the performance memory unit adapted to contain the performance parameters assigned to the blocks.

13. The memory device according to claim 12 further comprising the controller coupled to the performance memory unit, the controller operable to select one of the multitude of blocks in the performance memory unit based upon the performance parameters assigned to the blocks and/or to the sectors.

14. The memory device according to claim 13 wherein at least one block of the multitude of blocks is assigned to a group of defective blocks if its performance parameter is worse than a given value.

15. The memory device according to claim 14 wherein the controller is operable to execute memory access only to memory cells assigned to blocks which are not assigned to the group of defective blocks.

16. A method for operating a memory device comprising a memory cell array, which comprises a multitude of memory cells, each memory cell having an access characteristic and operable to store information, each memory cell assigned to one of a multitude of blocks, the memory device further comprising a performance memory unit, the method comprising:
applying an access signal comprised of a pulse sequence to the memory cells assigned to one of the multitude of blocks in order to alter the information stored in a group of memory cells assigned to that block;
identifying the characteristic of each memory cell of the group of memory cells assigned to that block in response to the access signal and determining the number of pulses in said access signal applied during an alteration of information in the memory cell;
assigning a performance parameter to that block based upon the identified characteristics; and
entering the performance parameter into a list of the performance memory unit.

17. The method according to claim 16 wherein the step of assigning the performance parameter to the block comprises determining an maximum number of determined number of pulses in order to alter the stored information of the group of the memory cells which are assigned to the block.

18. The method according to claim 16 wherein identifying of the characteristic of the memory cell comprises detecting of altering the stored information of the memory cell while counting the number of pulses.

19. The method according to claim 18 wherein assigning the performance parameter comprises determining the number of pulses until altering of each stored information of the selected group of memory cells has been detected.

20. The method according to claim 16 wherein the group of memory cells includes each memory cell assigned to that block.

21. The method according to claim 16 wherein the group of memory cells is selected in order to store the same information into each memory cell assigned to the block after altering the stored information of the group of memory cells has been performed.

22. The method according to claim 16 wherein the step of assigning the performance parameter to the block comprises determining an extreme value of the identified characteristics.

23. The method according to claim 16 wherein the performance parameters are assigned to each block and entered into the list.

24. The method according to claim 16 wherein the list contains at least one performance parameter and the step of entering the assigned performance parameter includes overwriting one of the performance parameters contained in the list.

25. The method according to claim 24 wherein the performance parameter contained in the list is overwritten after having performed a comparison of the assigned performance parameter and the performance parameter contained in the list.

26. The method according to claim 16 wherein each block is assigned to one of a multitude of sectors, the method further comprising:
   assigning a further performance parameter to one of the multitude of sectors based upon the identified characteristics of the memory cells that are assigned to that sector; and
   entering the further performance parameter into the list.

27. The method according to claim 16 wherein at least one of the multitude of blocks is assigned to a group of defective blocks if the characteristic of at least one of the memory cells assigned to that block is larger than a given value.

* * * * *